United States Patent
Baran

(10) Patent No.: US 10,858,243 B2
(45) Date of Patent: Dec. 8, 2020

(54) BACKSIDE REINFORCEMENT STRUCTURE DESIGN FOR MIRROR FLATNESS

(71) Applicant: Microsoft Technology Licensing, LLC, Redmond, WA (US)

(72) Inventor: Utku Baran, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 171 days.

(21) Appl. No.: 16/101,744

(22) Filed: Aug. 13, 2018

(65) Prior Publication Data
US 2020/0048073 A1    Feb. 13, 2020

(51) Int. Cl.
| | | |
|---|---|---|
| *B81B 7/00* | (2006.01) | |
| *G01S 7/481* | (2006.01) | |
| *G02B 26/08* | (2006.01) | |
| *G02B 26/10* | (2006.01) | |
| *G02B 27/01* | (2006.01) | |
| *G02F 1/1335* | (2006.01) | |
| *H01L 21/762* | (2006.01) | |

(52) U.S. Cl.
CPC .......... *B81B 7/0029* (2013.01); *G01S 7/4817* (2013.01); *G02B 26/0833* (2013.01); *G02B 26/10* (2013.01); *G02B 27/0172* (2013.01); *G02F 1/133553* (2013.01); *H01L 21/7624* (2013.01); *B81B 2201/042* (2013.01)

(58) Field of Classification Search
CPC ............. B81B 7/0029; B81B 2201/042; G01S 7/4817; G02B 26/0833; G02B 26/10; G02B 27/0172; G02F 1/133553; H01L 21/7624

USPC .......................................................... 359/871
See application file for complete search history.

(56) References Cited

U.S. PATENT DOCUMENTS

2012/0162739 A1    6/2012 Yamada

FOREIGN PATENT DOCUMENTS

| EP | 3021155 A1 | 5/2016 |
|---|---|---|
| EP | 3070508 A1 | 9/2016 |

OTHER PUBLICATIONS

"International Search Report and Written Opinion Issued in PCT Application No. PCT/US19/038820", dated Sep. 6, 2019, 14 Pages.

(Continued)

*Primary Examiner* — Collin X Beatty
(74) *Attorney, Agent, or Firm* — Mark K. Young; Mayer & Williams, PC

(57) ABSTRACT

A micro-electro mechanical system (MEMS) scanner has a backside reinforcement structure configured to concentrate stress which is exerted against the reinforcement structure at contour points. The reinforcement structure is attached to an underside of a mirror to maintain mirror flatness. Characteristics and features of the contour points are variable based on the specific application, including considerations for the design of the MEMS scanner, mirror, and reinforcement structure. The contour points are configured for concentration of stress to relieve stress from relatively weaker areas on the reinforcement structure, thereby increasing reliability and performance of the MEMS scanner. For example, a point of failure on the reinforcement structure may be where a top silicon layer and transition layer (e.g., silicon oxide layer) adjoin. Implementation of the contour points can concentrate stress at the contour points and thereby relieve stress from the weaker areas.

13 Claims, 14 Drawing Sheets

(56) References Cited

OTHER PUBLICATIONS

Lee, et al., "SOI-based fabrication processes of the scanning mirror having vertical comb fingers," Sensors and Actuators A 102 (2002) pp. 11-18 (8 pages total).
University of Florida—EEL6935 Advanced MEMS Lecture 5 by Dr. Huikai Xie (Spring 2005) (5 pages total).
George K. Celler, "SOI Technology Driving The 21st Century Ubiquitous Electronics," ECS Transactions, 19 (4) pp. 3-14 (2009) (12 pages total).

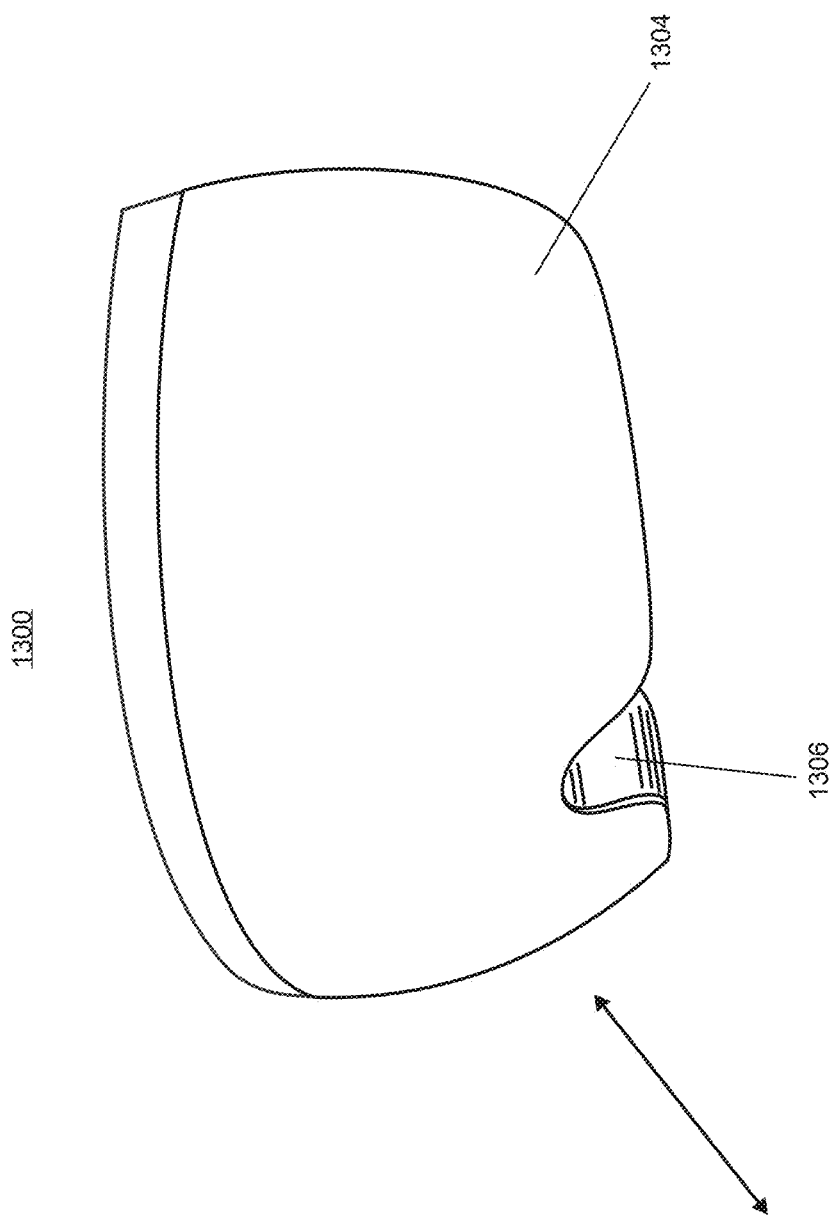
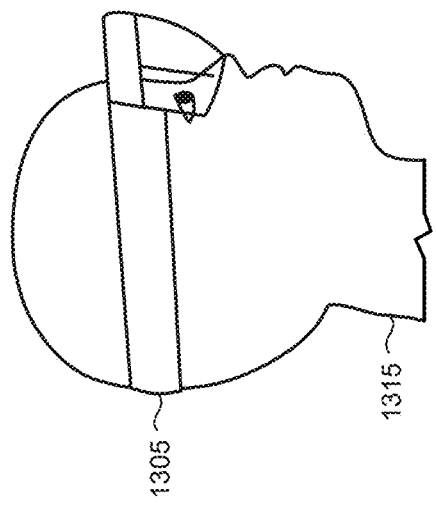
FIG 13

BACKSIDE REINFORCEMENT STRUCTURE DESIGN FOR MIRROR FLATNESS

BACKGROUND

A micro-electro mechanical system (MEMS) scanner is implemented to reflect light beams which originate from light diodes, lasers, or imaging devices. While the MEMS scanner can be coupled to reinforcement structures, these structures can have points of failure which succumb to stress experienced by the MEMS scanner.

SUMMARY

A micro-electro mechanical system (MEMS) scanner has a backside reinforcement structure which is configured and designed to concentrate stress which is experienced by the reinforcement structure at contour points. The MEMS scanner is configured with a reflecting layer, such as a mirror, to reflect received light beams. The reinforcement structure is positioned on an underside of the reflecting layer (i.e., opposite the reflecting side) to provide support so that the reflecting layer maintains its flatness and does not succumb to deformities during operation. The reflecting layer is coupled to a top (i.e., frontside) silicon layer, and the reinforcement structure includes a transition layer and a bottom silicon layer, in which the transition layer is coupled to the top silicon layer. In typical implementations, the transition layer is a silicon oxide composition which forms a silicon-on-oxide (SOI) wafer on a backside of the reflecting layer.

Stress exerted against the reinforcement structure may concentrate at areas at which the structure is relatively weak which can lead to breakage. For example, where the top silicon layer and transition layer adjoin may be a weak point which is susceptible to breakage when under a level of stress. The reinforcement structure can be configured with contour points which extend from the reinforcement structure and at which the stress can be concentrated, thereby relieving stress known to engage the weaker areas of the structure, for example, at the adjoined area of the top silicon and transition layers. By pushing the stress contours away using the contour points to minimize stress at the transition area, the MEMS devices can be made more durable. The goal is to maximize the reinforcement structure to keep the reflecting layer flat during high speed rotation of the MEMS scanner, while keeping the stress low at the transition points. The contour points can be projections, extensions, and the like, comprised of the same material as the reinforcement structure. The shape, size, length, and location of the contour points relative to the reinforcement structure may vary based on the specific application. For example, the design of the MEMS scanner, reflecting layer, and torsional flexures which facilitate rotation may affect where the contour points are positioned. The implementation of the contour points can be applied to different scanner designs that utilize various actuation principles, including electromagnetic, piezoelectric, and electrostatic.

The contour points advantageously increase the reliability and performance of the reinforcement structure and thereby the MEMS scanner. Where the reinforcement structure previously succumbed to breakage from the stress when the MEMS scanner operated at certain frequencies, the contour points enable the reinforcement structure to successfully operate at such and greater frequency levels. Other improvements to the reinforcement structure include creating cavities at locations at which less reinforcement is needed so as to reduce the mass of the MEMS scanner. The implementation of the contour points and cavities can, individually and collectively, increase the operational performance and reliability of the MEMS scanner.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. It will be appreciated that the above-described subject matter may be implemented as a computer-controlled apparatus, a computer process, a computing system, or as an article of manufacture such as one or more computer-readable storage media. These and various other features will be apparent from a reading of the following Detailed Description and a review of the associated drawings.

DESCRIPTION OF THE DRAWINGS

FIG. 13 shows a pictorial front view of a sealed visor that may be used as a component of a head mounted display (HMD) device;

DETAILED DESCRIPTION

Figure 1:
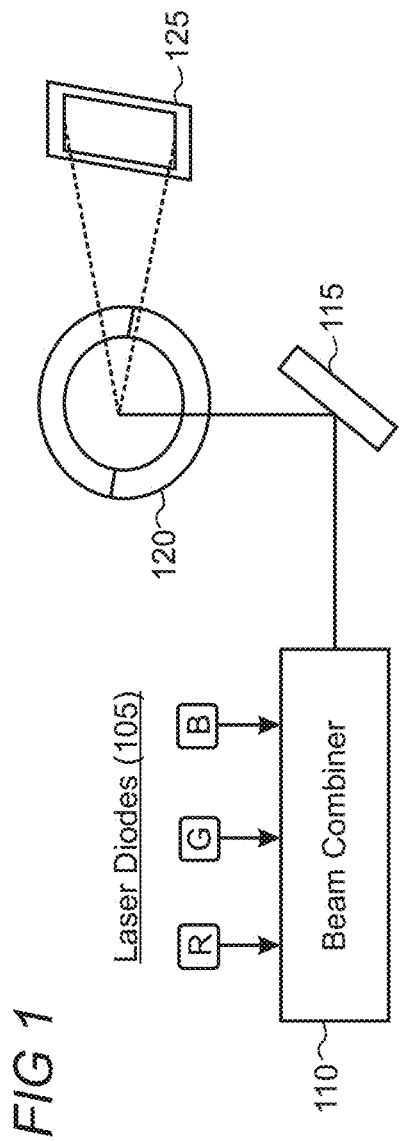
FIG. 1 shows an illustrative display system with a micro-electro mechanical system (MEMS) scanner.

FIG. 1 shows a diagram which employs a micro-electro mechanical system (MEMS) scanner 120 in a display system. The laser diodes 105 generate light beams which are fed into the beam combiner 110. The beam combiner is configured to combine the outputs of the multiple laser sources so as to obtain a single output beam, and may be implemented as an exit pupil expander, a numerical aperture converter, or other suitable system. The light beams from the beam combiner are transmitted to fixed mirror 115 which reflects the light beam to the MEMS scanner 120 which in turn reflects the light beam for display on the screen 125. Additional details about the features and characteristics of the MEMS scanner are produced below.

Figure 2:
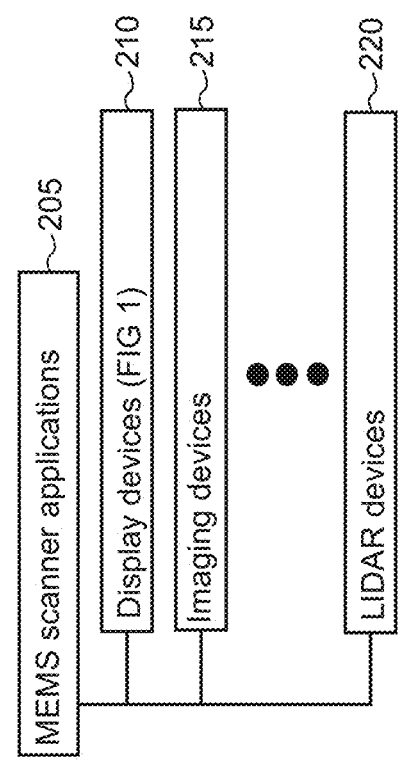
FIG. 2 shows illustrative applications for a MEMS scanner.

FIG. 2 shows a taxonomy of applications 205 in which MEMS scanners may be implemented. For example, while FIG. 1 shows one scenario in which MEMS scanners are utilized in display devices 210, MEMS scanners can additionally be used in imaging devices 215 and LIDAR (Light Detection and Ranging) devices 220, among other devices as represented by the ellipsis in FIG. 2. Although the disclosure may use the example of MEMS scanners utilized in display devices, head mounted display devices, and the like, the disclosure likewise applies to other implementations of MEMS scanners as illustratively provided in FIG. 2.

Figure 3:
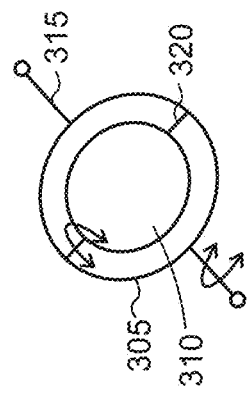
FIGS. 3 and 4 show illustrative rotational axes for a MEMS scanner.
Figure 4:
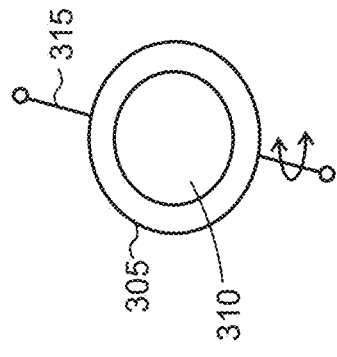

FIGS. 3 and 4 show an illustrative MEMS scanner 305 that is configured to rotate about one or more axes and use reflecting layer 310 to reflect light beams. For example, FIG. 3 shows the MEMS scanner configured to rotate about a single axis and FIG. 4 shows the MEMS scanner configured to rotate about two axes. The specific configuration of the MEMS scanner may depend on the specific device in which the MEMS scanner is disposed. For the reflecting layer to rotate about the one or more axes, torsional flexures 315 and 320, for example, are utilized. For the respective axis, the torsional flexures may be placed on opposite ends of the reflecting layer as shown. The flexures may be positioned on a longitudinal or transverse axis of the MEMS scanner. Due to the high frequency movement facilitated by the flexures, stress may develop from these flexures and distribute to portions of the MEMS scanner, as discussed in further detail below.

Figure 5:
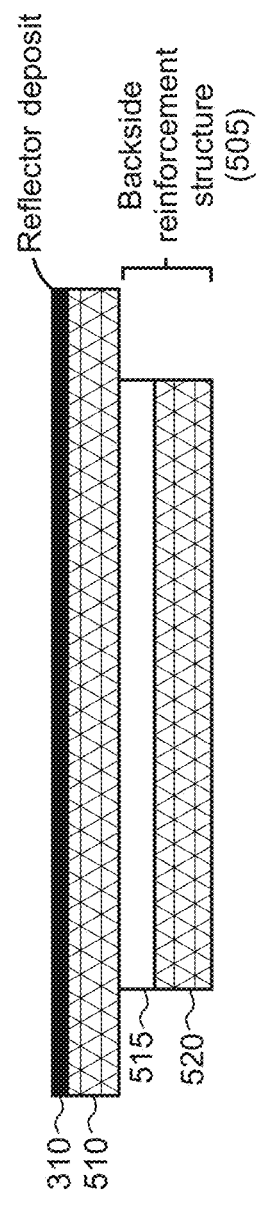
FIG. 5 shows an illustrative composition of the MEMS scanner.

FIG. 5 shows an illustrative diagram of the MEMS scanner's 305 composition. The reflecting layer 310 includes a reflecting deposit of materials, such as a metal (e.g., aluminum, gold), a mirror, bare silicon, dielectric stack, among others. For clarity of disposition the reflecting layer may be referenced solely as a mirror, but it should be understood that other reflecting deposits are also possible.

The MEMS scanner includes a backside reinforcement structure (collectively represented by numeral 505) which is coupled to a top (frontside) silicon layer 510 on a backside of the mirror, that is, opposite the reflecting side of the mirror. The reinforcement structure includes a bottom (i.e., backside) silicon layer 520 and a transition layer 515 positioned between the top and bottom silicon layers. The reinforcement structure may be considered a silicon-on-insulator (SOI) wafer in instances in which the transition layer is comprised of silicon-oxide. The reinforcement structure may alternatively be a silicon-on-sapphire (SOS) wafer in instances in which the transition layer is sapphire. The reinforcement structure is utilized with a MEMS scanner to maintain mirror flatness, such as during operation of the MEMS scanner. The colors and designs depicted for each layer in FIG. 5 is used to comprehensibly illustrate the various layers in graphical form.

The design and configuration of the reinforcement structure, such as an SOI wafer, may be manufactured using various processes, including Bond and Etch method, Separation by IMplantation of OXygen (SIMOX), or Smartcut™. Thus, discussion of the designs and configurations of the reinforcement structure may be performed using one of these processes.

Figure 6:
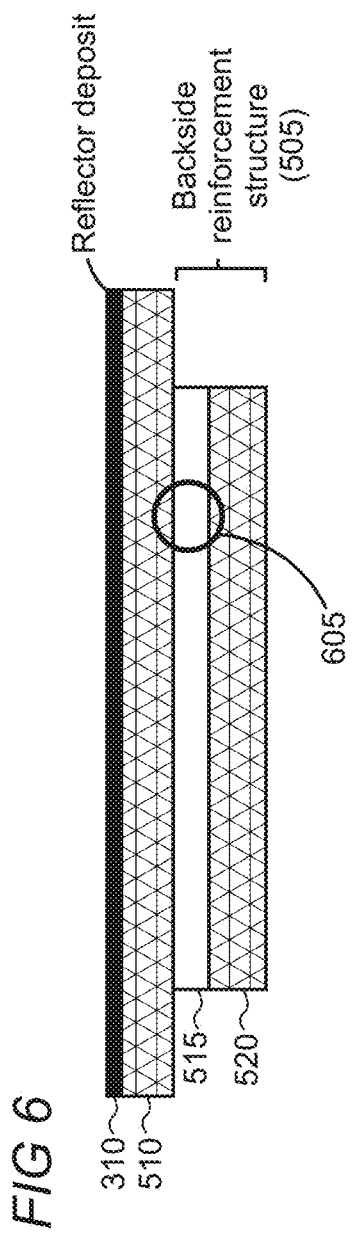
FIG. 6 shows an illustrative diagram of where stress is experienced by a backside reinforcement structure of the MEMS scanner.

FIG. 6 shows an illustrative diagram where the backside reinforcement structure experiences stress at area 605. The stress may be dynamic in that it is experienced during operation of the MEMS scanner or may be static stress. The stress may be generated by the MEMS scanner moving at high speeds using the torsional flexures or other movement mechanism. The high frequency movement of the MEMS scanner can create stress which is then distributed and experienced by the reinforcement structure.

The stress can in part be concentrated where the top silicon layer 510 and transition layer 515 adjoin each other. Where the top silicon and transition layers merge may be a point of failure of the MEMS scanner, and thus excessive stress at and around that location can cause breakage of the reinforcement structure and ultimately cause bending of the mirror. In turn, the performance of the MEMS scanner may be limited to accommodate potential breakage at that location.

Figure 7:
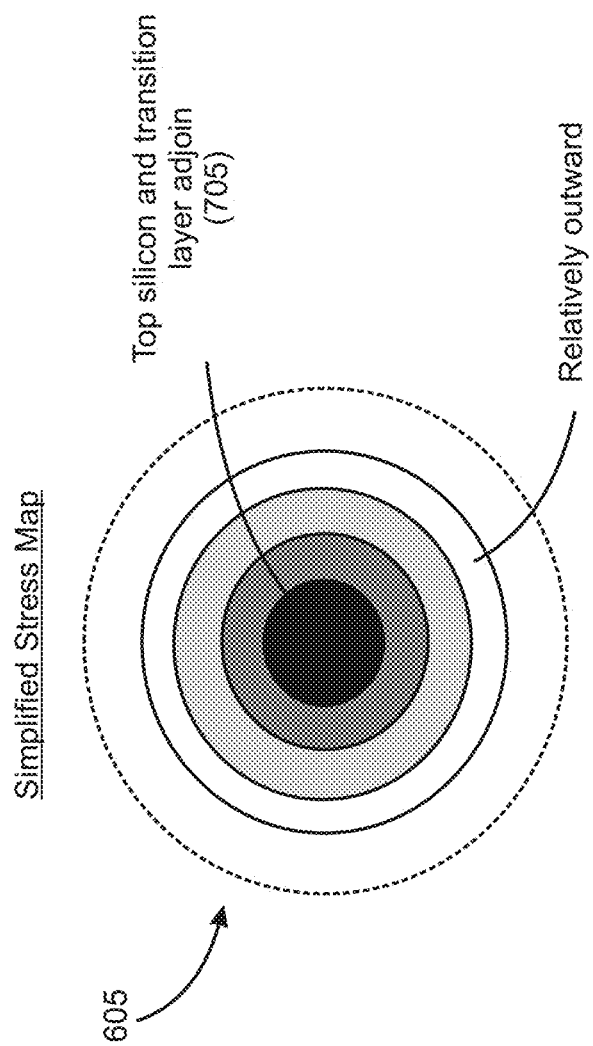
FIG. 7 shows a simplified stress map of the diagram in FIG. 6.

FIG. 7 shows a simplified stress map of the area 605 from FIG. 6. The dark color in the center shows greater stress and the lighter colors distal from the center represent relatively less stress experienced by portions of the reinforcement structure. For example, the center 705 represents the high stress experienced where the top silicon and transition layer adjoin, whereas relatively outward from that area relatively less stress may be experienced.

Figure 8:
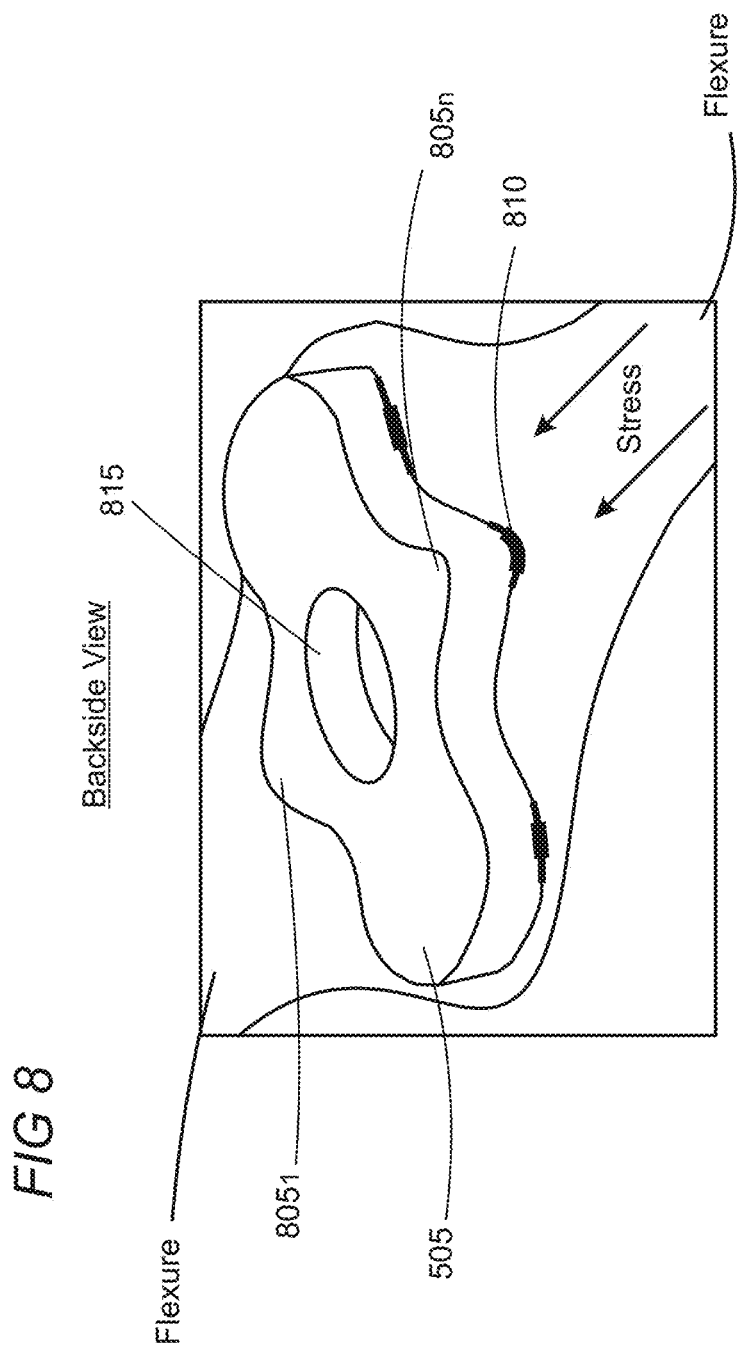
FIG. 8 is an illustrative diagram of stress distribution facilitated by the design of the backside reinforcement structure.
Figure 9:
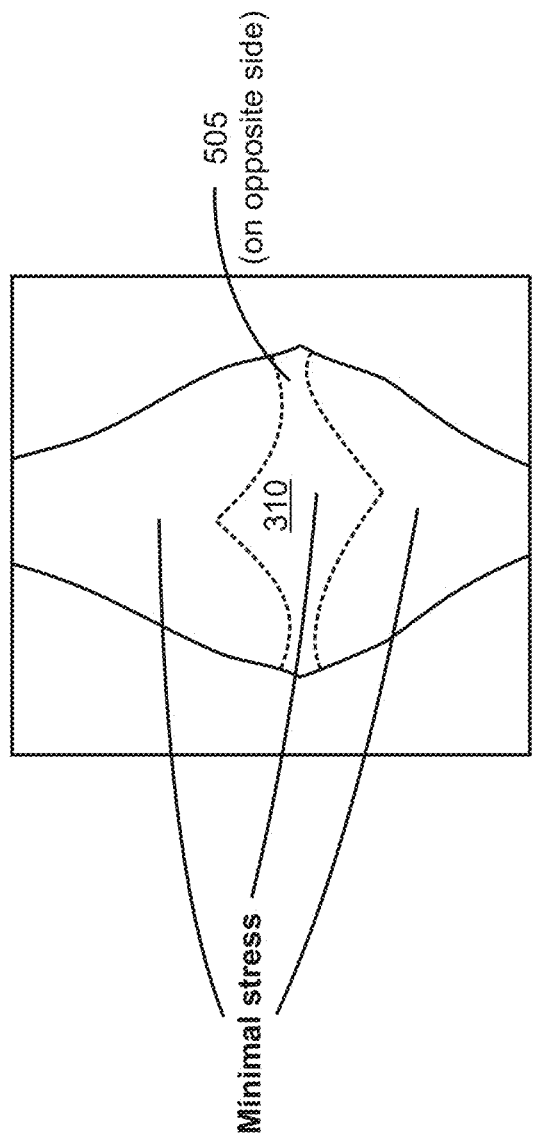
FIG. 9 shows an illustrative diagram of stress experienced by a frontside of the MEMS scanner.

FIGS. 8 and 9 show respectively a backside and frontside (reflecting side) of a portion of the MEMS scanner to illustrate the distribution of stress. FIG. 8 shows an illustrative diagram in which the backside reinforcement structure 505 is configured and designed to distribute stress to other areas of the structure so the high stress area (i.e., area 705 from FIG. 7) is relieved of at least some of its stress. The shape of the reinforcement structure is designed with contour points 805. The contour points are formed of the reinforcement structure and are configured during the design for the given implementation. The contour points may be considered projections or extensions from the reinforcement structure, which typically extend parallel to the mirror. The contour points may face a direction in which stress is incoming to the reinforcement structure. For example, if the stress originates from the flexures during operation of the MEMS scanner, then the contour points may be oriented toward the flexures to concentrate some of the stress at the contour points. When the flexures are positioned along a longitudinal axis of the MEMS scanner, then the contour points may face the longitudinal axis to compensate for the stress generated by the flexures. The contour points are designed to cover particular areas on the structure, in which case they may form angles, such as an acute, obtuse, or right angle. In typical implementations the contour points may form an acute angle so the remainder of the structure can stay in typical form, that is, the contour point is a temporary extension outward from the reinforcement structure relative to the remainder of the structure.

The contour points are configured to receive and concentrate some of the stress that may be experienced at the backside reinforcement structure. Thus, instead of the reinforcement structure receiving and experiencing stress at the transition layer or where the top silicon layer and transition layer adjoin, the configuration of the structure distributes the stress to other areas (e.g., to the contour points) to minimize the stress experienced by the weaker areas. During the design of the contour points on the reinforcement structure, consideration is given to distribute a sufficient value of stress away from the weaker areas, while not forcing or distributing excessive stress to the contour points which can lead to breakage. The amount of stress distributed may be below a predetermined value (e.g., in Pascal or psi) which is tested or understood to cause bending of the mirror or breakage at the transition from the top silicon layer to the transition layer.

Thus, the contour points are designed so as to distribute a specific amount of stress to those points. Implementation of the contour points can result in higher stress tolerance of the reinforcement structure and therefore provide overall greater performance and reliability of the MEMS scanner. The MEMS scanner, for example, can be pushed to higher operational limits.

FIG. 8 shows the distribution of the stress 810 at various sections of the reinforcement structure. The contour points 805 provide at least some barrier to stress that is experienced by the structure as illustratively shown by the arrows. Although two contour points are shown, in other embodiments one or greater than two contour points are also possible depending on the overall design of the mirror and MEMS scanner. Stress is in part concentrated and distributed at the contour points, otherwise the stress would be directed to the weaker area, that is, where the top silicon layer and transition layer adjoin.

The reinforcement structure may be configured with a cavity 815 in areas in which less materials are necessary to reduce mass of the MEMS scanner. For example, the center of the MEMS scanner, reinforcement structure, and mirror may be low stress areas. Therefore, carving out the cavity at that area of the reinforcement structure can reduce mass of the MEMS scanner which can also facilitate greater performance. The cavity may be in the bottom silicon layer or alternatively may range from the bottom layer to transition and top layers. Although a single and circular cavity is depicted in FIG. 8, more than one cavity may be implemented of varying shapes depending on the design of the MEMS scanner, mirror, and reinforcement structure.

FIG. 9 shows a front side reflecting layer view of the MEMS scanner which complements the backside view shown in FIG. 8. In contrast to the reinforcement structure, during operation, the reflecting layer side experiences relatively minimal stress for the MEMS scanner, in part due to the support provided by the reinforcement structure. The representative numeral for the mirror 310 is used to show an approximate location of the mirror if it were portrayed in FIG. 9.

Figure 10:
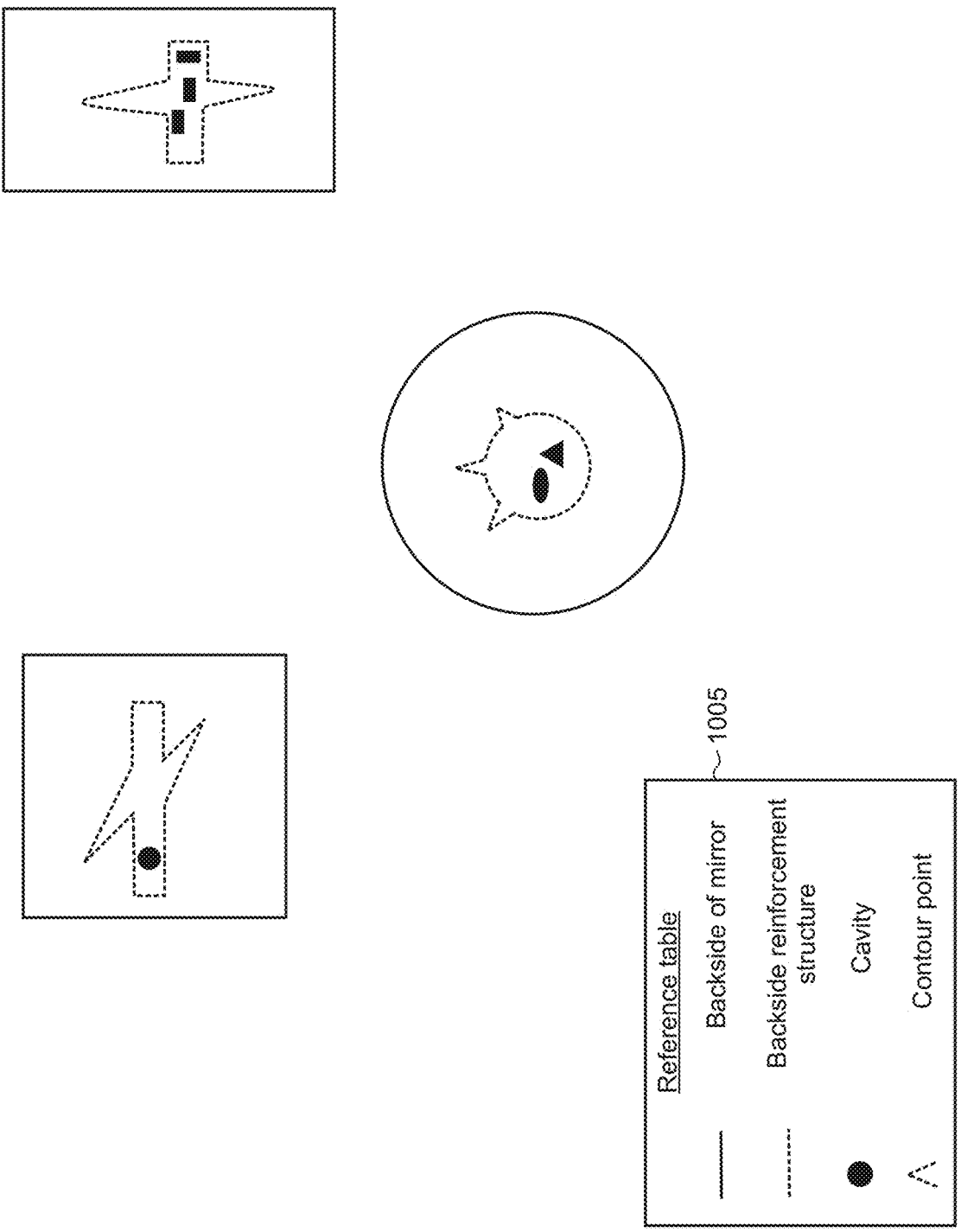
FIG. 10 shows illustrative alternative designs and arrangements of the backside reinforcement structure and cavity based on the implemented mirror.

FIG. 10 shows illustrative embodiments in which the reinforcement structure and cavity can be configured differently depending on the design of, for example, the mirror. The reference table 1005 shows the representation of the components in each example. As shown, the cavity, contour points, and reinforcement structure vary in each of the scenarios to accommodate differences in stress concentration facilitated by the design of the mirror, flexures, reinforcement structure, and MEMS scanner overall. For example, various flexures or other movement mechanisms can exert more or less stress than others and may be positioned differently relative to the mirror. Similarly, certain reinforcement structures and mirrors may be stronger or weaker than others. The unique design of the given MEMS scanner and its components may therefore dictate the necessary contour point design, shape, and position. In each instance stress may be concentrated at the contour points as a way to direct and distribute the stress away from the point at which the top silicon layer and transition layer adjoin, as discussed above with respect to FIG. 8.

Figure 11:
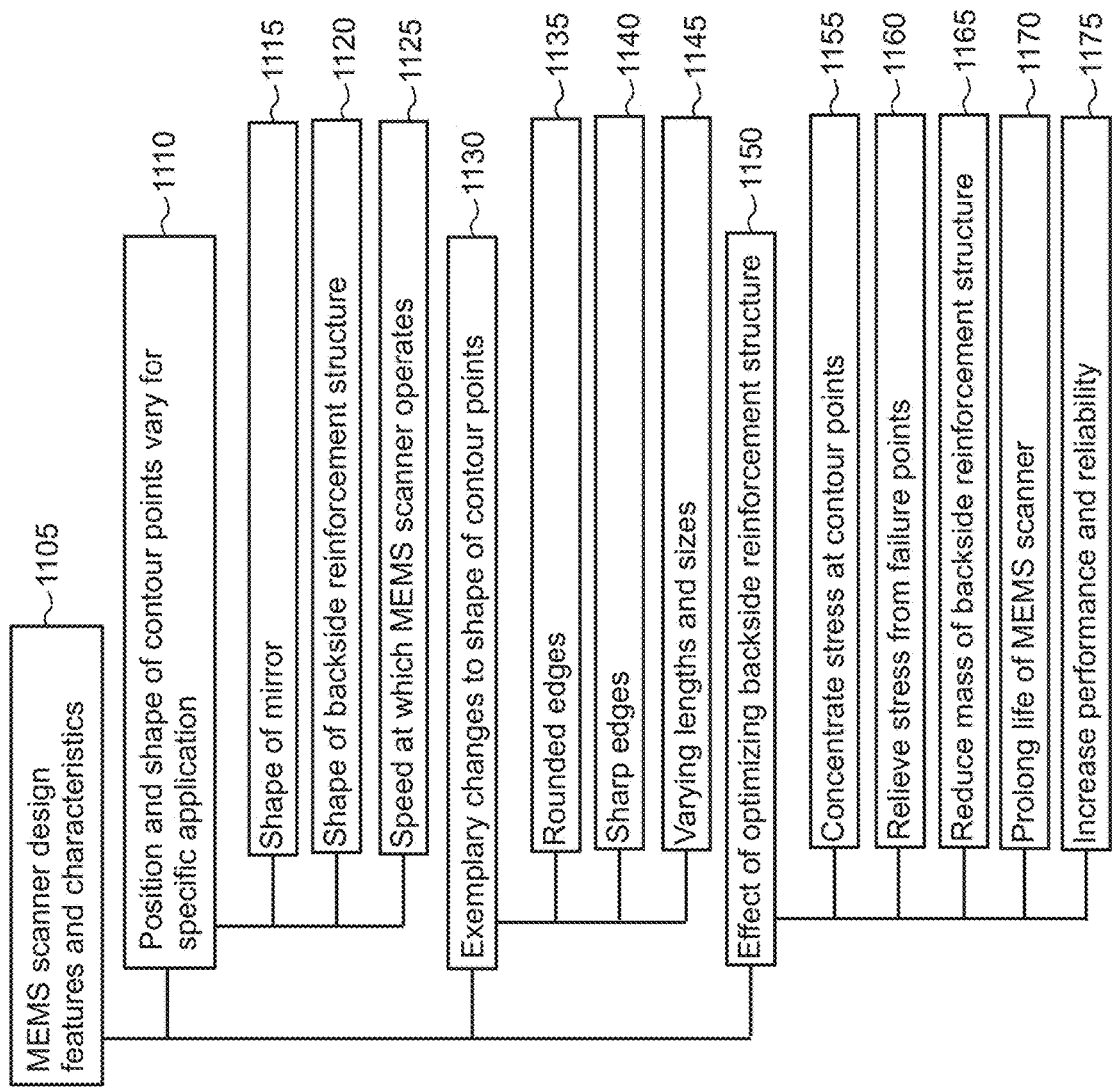
FIG. 11 shows an illustrative taxonomy of features and characteristics of the implemented MEMS scanner.

FIG. 11 shows an illustrative taxonomy of MEMS scanner design features and characteristics 1105 which can facilitate the distribution of stress for the backside reinforcement structure. The position and shape of the contour points vary for the specific application 1110. The position and shape of the contour points may be affected by the shape of the mirror 1115, the shape of the backside reinforcement structure 1120, and the speed at which the MEMS scanner operates 1125.

Exemplary changes to the shape of the contour points 1130 based on the specific application can include having rounded edges 1135, sharp edges 1140, and varying lengths and sizes 1145.

The design and configuration of the backside reinforcement structure can have several optimizing effects, as representatively illustrated by numeral 1150. For example, the reinforcement structure can concentrate stress at the contour points 1155, relieve stress from failure points (e.g., silicon-oxide transition layer, and transition between top silicon layer and silicon-oxide layer) 1160, reduce mass of backside reinforcement structure (e.g., by creating cavities in the structure) 1165, prolong the life of the MEMS scanner 1170, and increase performance and reliability of the MEMS scanner 1175.

FIGS. 12-17 show illustrative diagrams and systems in which the present backside reinforcement structure design for mirror flatness may be implemented. The implementation for the head mounted display (HMD) device is exemplary, and other environments may also use the present design of the reinforcement structure, such as in LIDAR and imaging systems.

Figure 12:
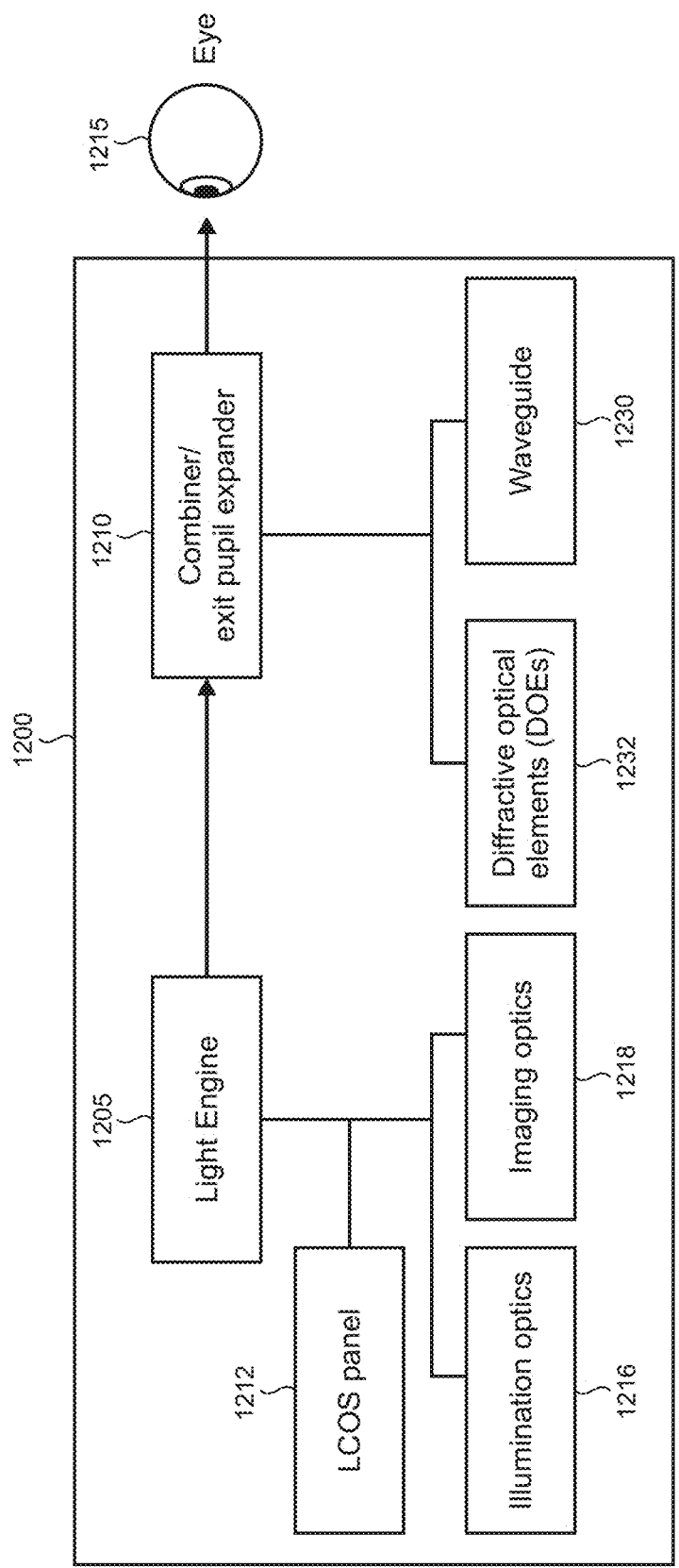
FIG. 12 shows a block diagram of an illustrative near-eye display system.

FIG. 12 shows a block diagram of an illustrative near-eye display system 1200 which may incorporate a light engine 1205 and a combiner 1210 such as an exit pupil expander (EPE), NA (numerical aperture) converter, or other suitable system. The EPE in this illustrative example comprises a waveguide 1230 on which multiple diffractive optical elements (DOEs) 1232 are disposed and configured to provide in-coupling of incident light into the waveguide, exit pupil expansion in two directions, and out-coupling of light out of the waveguide to an eye 1215 of a system user. Near-eye display systems are often used, for example, in HMD devices in industrial, commercial, and consumer applications. Other devices and systems may also use near-eye display systems, as described below. The near-eye display system 1200 is an example that is used to provide context and illustrate various features and aspects of the present backside reinforcement structure design for mirror flatness.

The light engine 1205 in system 1200 may include one or more virtual image sources or imagers, such as a LCOS panel 1212, that work with the combiner 1210 to deliver images as a virtual display to a user's eye 1215. The LCOS panel may comprise a micro-display that provides an array of pixels (picture elements). Other image sources may include RGB (red, green, blue) displays, light emitting diodes (LEDs), OLED (organic light emitting diode) devices, liquid crystal (LC) displays, digital light processing (DLP) displays, or combinations thereof. In this illustrative example, the LCOS panel operates in reflection, but transmissive or emissive display arrangements may be used in alternative embodiments. The light engine 1205 may further comprise illumination optics 1216 and imaging optics 1218 that may be configured to provide illumination in a range of wavelengths and intensities as needed to suit a given implementation.

The LCOS panel 1212 can alternatively utilize two types of light modulation including amplitude modulation and phase modulation. In the former case, the amplitude of the light signal is modulated by varying the linear polarization direction of the incident light passing through a linear polarizer, the same principle used in standard LC displays. In the latter case, the phase delay is accomplished by electrically adjusting the optical refractive index along the light path (which is possible because the LC materials utilized in the display can have non-zero birefringence).

In a near-eye display system the imager does not actually shine the images on a surface such as a glass lens to create the visual display for the user. This is not feasible because the human eye cannot focus on something that is that close. Rather than create a visible image on a surface, the near-eye display system 1200 uses combiner 1210, such as an exit pupil expander, to form a pupil and the eye 1215 acts as the last element in the optical chain and converts the light from the pupil into an image on the eye's retina as a virtual display.

The waveguide 1230 facilitates light transmission between the imager and the eye. One or more waveguides can be utilized in the near-eye display system because they are transparent and because they are generally small and lightweight (which is desirable in applications such as HMD devices where size and weight are generally sought to be minimized for reasons of performance and user comfort). For example, the waveguide 1230 can enable the imager to be located out of the way, for example, on the side of the user's head or near the forehead, leaving only a relatively small, light, and transparent waveguide optical element in front of the eyes. In one implementation, the waveguide 1230 operates using a principle of total internal reflection, FIG. 13 shows an illustrative example of a visor 1300 that incorporates an internal near-eye display system that is used in a head mounted display (HMD) device 1305 application worn by a user 1315. The visor 1300, in this example, is sealed to protect the internal near-eye display system. The visor 1300 typically interfaces with other components of the HMD device 1305 such as head mounting/retention systems and other subsystems including sensors, power management, controllers, etc., as illustratively described in conjunction with FIGS. 15 and 16. Suitable interface elements (not shown) including snaps, bosses, screws and other fasteners, etc. may also be incorporated into the visor 1300.

The visor 1300 includes see-through front and rear shields, 1304 and 1306 respectively, that can be molded using transparent materials to facilitate unobstructed vision to the optical displays and the surrounding real-world environment. Treatments may be applied to the front and rear shields such as tinting, mirroring, anti-reflective, anti-fog, and other coatings, and various colors and finishes may also be utilized. The front and rear shields are affixed to a chassis 1405 shown in the disassembled view in FIG. 14.

The sealed visor 1300 can physically protect sensitive internal components, including a near-eye display system 1402 (shown in FIG. 14), when the HMD device is in operation and during normal handling for cleaning and the like. The near-eye display system 1402 includes left and right waveguide displays 1410 and 1415 that respectively provide virtual world images to the user's left and right eyes for mixed- and/or virtual-reality applications. The visor 1300 can also protect the near-eye display system 1402 from environmental elements and damage should the HMD device be dropped or bumped, impacted, etc.

Figure 14:
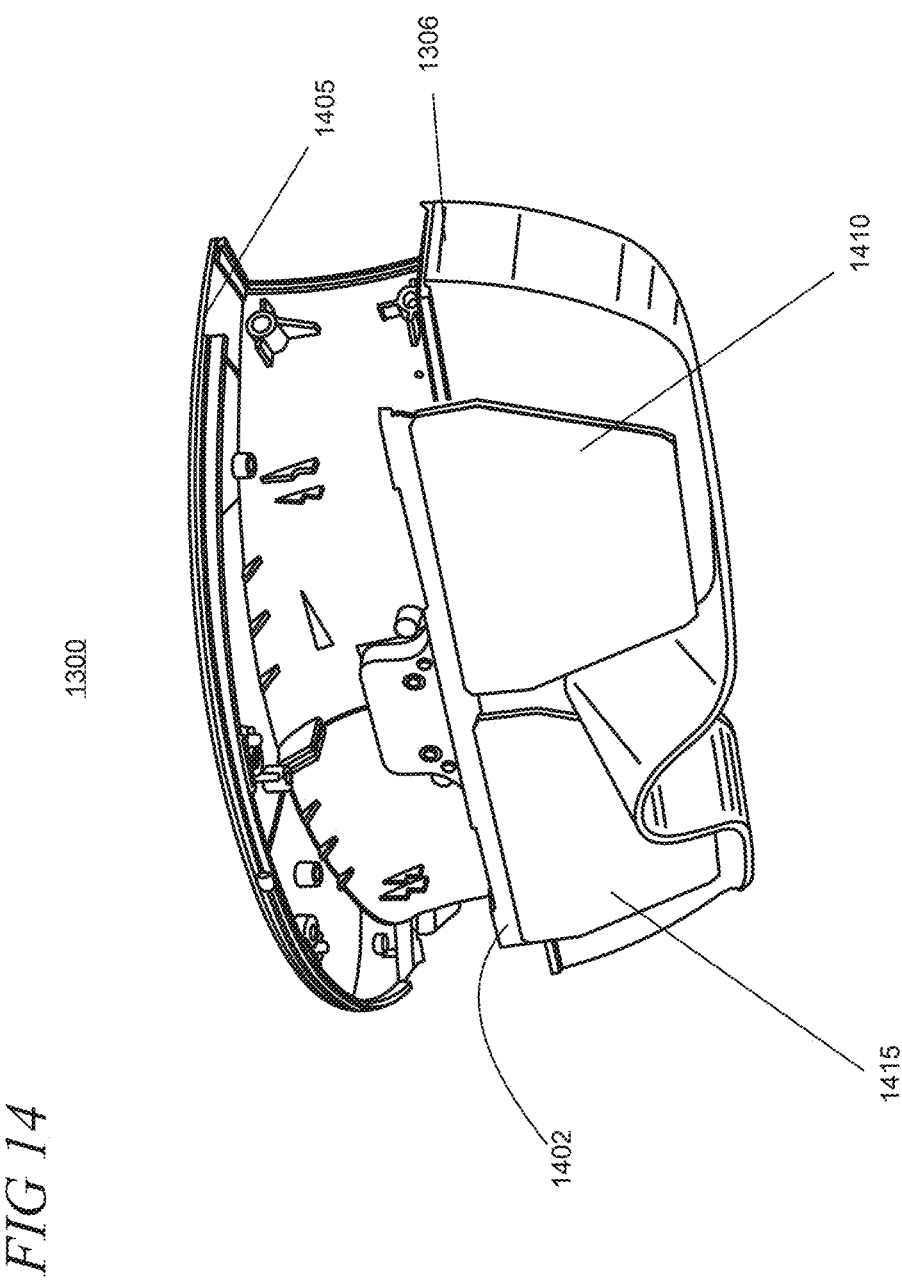
FIG. 14 shows a partially disassembled view of the sealed visor.

As shown in FIG. 14, the rear shield 1306 is configured in an ergonomically suitable form to interface with the user's nose, and nose pads and/or other comfort features can be included (e.g., molded-in and/or added-on as discrete components). The sealed visor 1300 can also incorporate some level of optical diopter curvature (i.e., eye prescription) within the molded shields in some cases.

Figure 15:
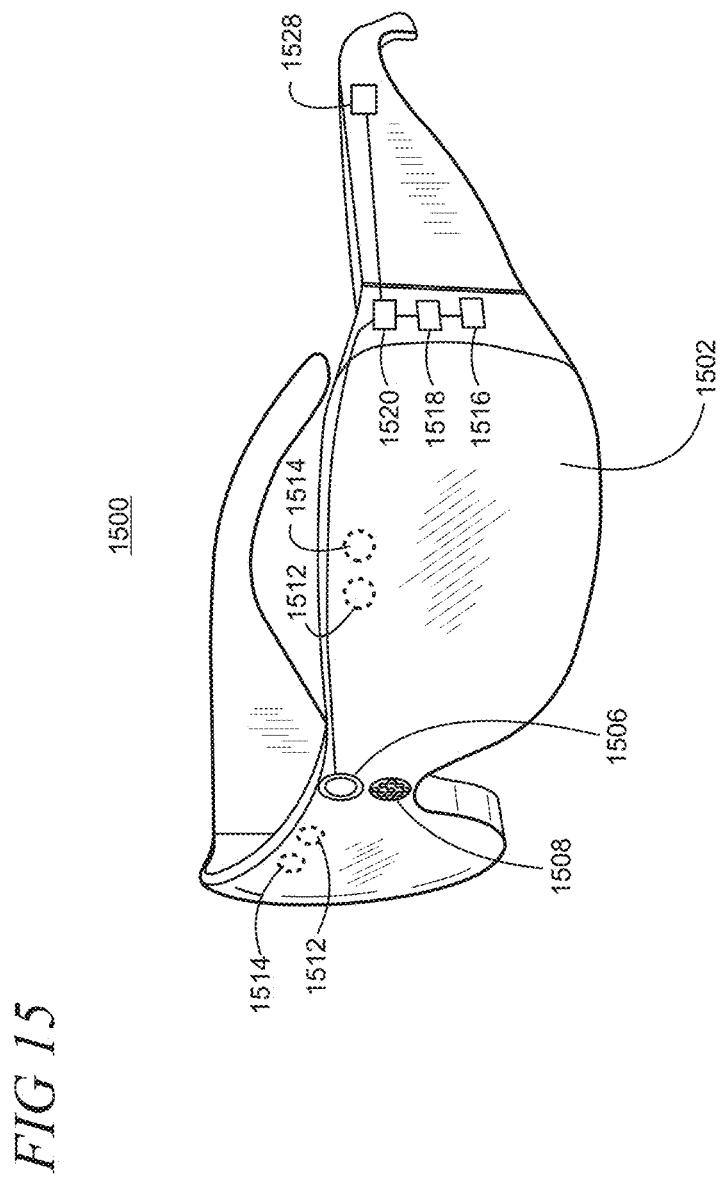
FIG. 15 is a pictorial view of an illustrative example of a virtual reality or augmented reality HMD device that may use a backside reinforcement structure design for mirror flatness in a MEMS scanner.
Figure 16:
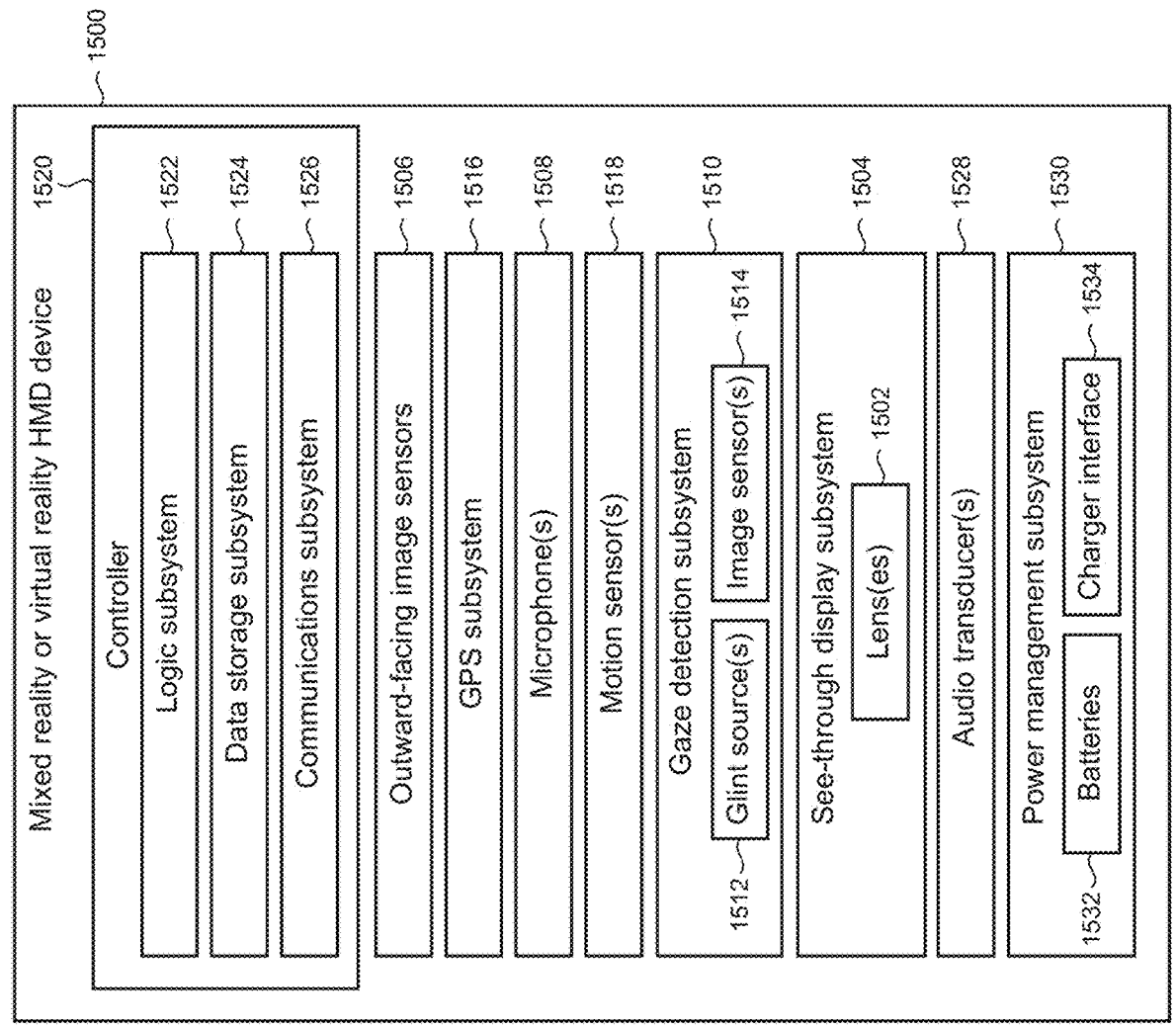
FIG. 16 shows a block diagram of an illustrative example of a virtual reality or augmented reality HMD device that may use a backside reinforcement structure design for mirror flatness in a MEMS scanner.

The present backside reinforcement structure design for mirror flatness may be utilized in augmented- or virtual-reality applications. FIG. 15 shows one particular illustrative example of an augmented-reality HMD device 1500, and FIG. 16 shows a functional block diagram of the device 1500. HMD device 1500 comprises one or more lenses 1502 that form a part of a see-through display subsystem 1504, so that images may be displayed using lenses 1502 (e.g. using projection onto lenses 1502, one or more waveguide systems, such as a near-eye display system, incorporated into the lenses 1502, and/or in any other suitable manner). HMD device 1500 further comprises one or more outward-facing image sensors 1506 configured to acquire images of a background scene and/or physical environment being viewed by a user, and may include one or more microphones 1508 configured to detect sounds, such as voice commands from a user. Outward-facing image sensors 1506 may include one or more depth sensors and/or one or more two-dimensional image sensors. In alternative arrangements, as noted above, a mixed reality or virtual reality display system, instead of incorporating a see-through display subsystem, may display mixed reality or virtual reality images through a viewfinder mode for an outward-facing image sensor.

The HMD device 1500 may further include a gaze detection subsystem 1510 configured for detecting a direction of gaze of each eye of a user or a direction or location of focus, as described above. Gaze detection subsystem 1510 may be configured to determine gaze directions of each of a user's eyes in any suitable manner. For example, in the illustrative example shown, a gaze detection subsystem 1510 includes one or more glint sources 1512, such as infrared light sources, that are configured to cause a glint of light to reflect from each eyeball of a user, and one or more image sensors 1514, such as inward-facing sensors, that are configured to capture an image of each eyeball of the user. Changes in the glints from the user's eyeballs and/or a location of a user's pupil, as determined from image data gathered using the image sensor(s) 1514, may be used to determine a direction of gaze.

In addition, a location at which gaze lines projected from the user's eyes intersect the external display may be used to determine an object at which the user is gazing (e.g. a displayed virtual object and/or real background object). Gaze detection subsystem 1510 may have any suitable number and arrangement of light sources and image sensors. In some implementations, the gaze detection subsystem 1510 may be omitted.

The HMD device 1500 may also include additional sensors. For example, HMD device 1500 may comprise a global positioning system (GPS) subsystem 1516 to allow a location of the HMD device 1500 to be determined. This may help to identify real-world objects, such as buildings, etc. that may be located in the user's adjoining physical environment.

The HMD device 1500 may further include one or more motion sensors 1518 (e.g., inertial, multi-axis gyroscopic, or acceleration sensors) to detect movement and position/orientation/pose of a user's head when the user is wearing the system as part of a mixed reality or virtual reality HMD device. Motion data may be used, potentially along with eye-tracking glint data and outward-facing image data, for gaze detection, as well as for image stabilization to help correct for blur in images from the outward-facing image sensor(s) 1506. The use of motion data may allow changes in gaze direction to be tracked even if image data from outward-facing image sensor(s) 1506 cannot be resolved.

In addition, motion sensors 1518, as well as microphone (s) 1508 and gaze detection subsystem 1510, also may be employed as user input devices, such that a user may interact with the HMD device 1500 via gestures of the eye, neck and/or head, as well as via verbal commands in some cases. It may be understood that sensors illustrated in FIGS. 15 and 16 and described in the accompanying text are included for the purpose of example and are not intended to be limiting in any manner, as any other suitable sensors and/or combination of sensors may be utilized to meet the needs of a particular implementation. For example, biometric sensors (e.g., for detecting heart and respiration rates, blood pressure, brain activity, body temperature, etc.) or environmental sensors (e.g., for detecting temperature, humidity, elevation, UV (ultraviolet) light levels, etc.) may be utilized in some implementations.

The HMD device 1500 can further include a controller 1520 such as one or more processors having a logic subsystem 1522 and a data storage subsystem 1524 in communication with the sensors, gaze detection subsystem 1510, display subsystem 1504, and/or other components through a communications subsystem 1526. The communications subsystem 1526 can also facilitate the display system being operated in conjunction with remotely located resources, such as processing, storage, power, data, and services. That is, in some implementations, an HMD device can be operated as part of a system that can distribute resources and capabilities among different components and subsystems.

The storage subsystem 1524 may include instructions stored thereon that are executable by logic subsystem 1522, for example, to receive and interpret inputs from the sensors, to identify location and movements of a user, to identify real objects using surface reconstruction and other techniques, and dim/fade the display based on distance to objects so as to enable the objects to be seen by the user, among other tasks.

The HMD device 1500 is configured with one or more audio transducers 1528 (e.g., speakers, earphones, etc.) so that audio can be utilized as part of a mixed reality or virtual reality experience. A power management subsystem 1530 may include one or more batteries 1532 and/or protection circuit modules (PCMs) and an associated charger interface 1534 and/or remote power interface for supplying power to components in the HMD device 1500.

It may be appreciated that the HMD device 1500 is described for the purpose of example, and thus is not meant to be limiting. It may be further understood that the display device may include additional and/or alternative sensors, cameras, microphones, input devices, output devices, etc. than those shown without departing from the scope of the present arrangement. Additionally, the physical configuration of an HMD device and its various sensors and subcomponents may take a variety of different forms without departing from the scope of the present arrangement.

Figure 17:
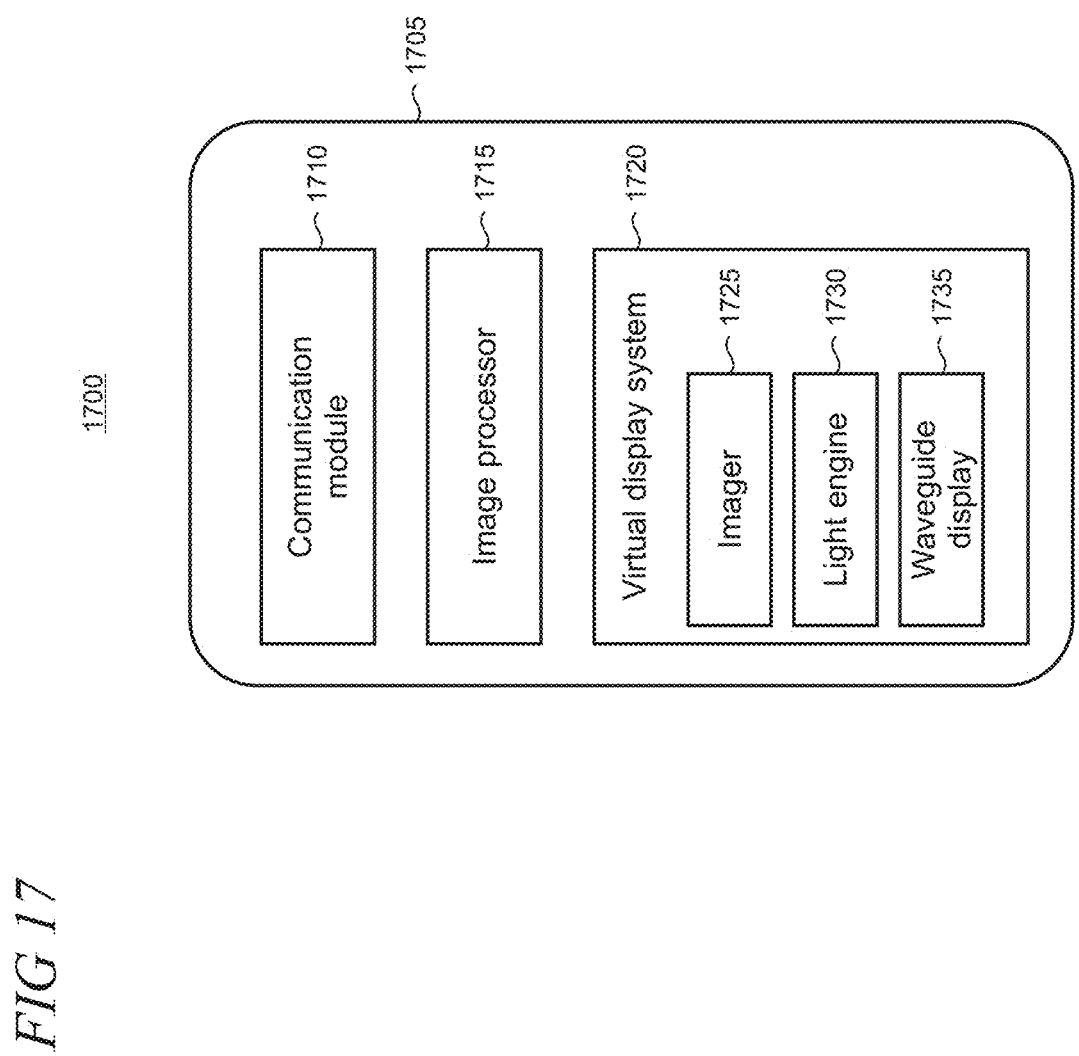
FIG. 17 shows a block diagram of an illustrative electronic device that incorporates an augmented reality display system that may use a backside reinforcement structure design for mirror flatness in a MEMS scanner.

As shown in FIG. 17, the backside reinforcement structure design for mirror flatness in a MEMS scanner can be used in a mobile or portable electronic device 1700, such as a mobile phone, smartphone, personal digital assistant (PDA), communicator, portable Internet appliance, hand-held computer, digital video or still camera, wearable computer, computer game device, specialized bring-to-the-eye product for viewing, or other portable electronic device. As shown, the portable device 1700 includes a housing 1705 to house a communication module 1710 for receiving and transmitting information from and to an external device, or a remote system or service (not shown).

The portable device 1700 may also include an image processor 1715 using one or more processors for handling the received and transmitted information, and a virtual display system 1720 to support viewing of images. The virtual display system 1720 can include a micro-display or an imager 1725, a light engine 1730, and a waveguide display 1735. The image processor 1715 may be operatively connected to the imager 1725 to provide image data, such as video data so that images may be displayed using the light engine 1730 and waveguide display 1735. An EPE may be included in the waveguide display 1735.

The backside reinforcement structure design for mirror flatness in a MEMS scanner may also be utilized in non-portable devices, such as gaming devices, multimedia consoles, personal computers, vending machines, smart appliances, Internet-connected devices, and home appliances, such as an oven, microwave oven and other appliances, and other non-portable devices.

Various exemplary embodiments of the present backside enforcement structure design for mirror flatness are now presented by way of illustration and not as an exhaustive list of all embodiments. An example includes a micro-electro mechanical system (MEMS) scanner disposed in an electronic device, the scanner having a longitudinal axis and a transverse axis, the scanner comprising: a mirror configured to reflect image light on a reflecting side of the mirror; and a silicon-on-insulator (SOI) wafer attached to an underside of the mirror opposite the reflecting side, the SOI wafer having a top silicon layer, a bottom silicon layer, and a silicon oxide layer disposed between the top silicon layer and the bottom silicon layer, wherein the SOI wafer is configured with one or more flexures disposed along the longitudinal axis to enable dynamic rotation of the mirror during scanning operations, and wherein the SOI wafer is configured as a backside reinforcement structure which includes one or more contour points aligned along the longitudinal axis in which dynamic stresses during scanning operations are maximized at the contour points so that stress concentrations are reduced at a transition between the silicon oxide layer and the top silicon layer.

In another example, the one or more contour points of the SOI wafer are projections which extend parallel to a surface area of the mirror. In another example, the one or more projections form an acute angle, obtuse angle, or a right angle. In another example, a shape of the projections depends on a specific application including a shape of the mirror, and the projections are shaped for the specific application to distribute a value of stress to the one or more contour points while not distributing excessive stress at the contour points which cause bending of the mirror. In another example, the SOI wafer includes rounded features extending laterally outward along the transverse axis. In another example, the electronic device in which the MEMS scanner is disposed includes any one of a display device, imaging device, and light detection and ranging (LIDAR) device.

A further example includes a micro-electro mechanical system (MEMS) scanner, comprising: a reflecting deposit having a frontside configured to reflect light and a backside opposite the frontside; a top silicon layer adjacent to the backside of the mirror; and a reinforcement structure adjacent to the top silicon layer, the reinforcement structure having a bottom silicon layer and a transition layer positioned between the top and bottom silicon layers, in which the reinforcement structure is configured to receive stress exerted on the MEMS scanner during operation and to maintain flatness of the mirror, wherein the reinforcement structure is configured to distribute stress which is directed to where the top silicon layer and the transition layer adjoin to a specific location on the reinforcement structure while an electronic device in which the MEMS scanner is disposed is in operation, so that stresses along the adjoined area are less than a failure stress level which causes bending of the mirror.

In another example, the specific location is a contour point on the reinforcement structure, and the configuration of the reinforcement structure is such that the stress is concentrated at the contour point. In another example, maximum dynamic stress is concentrated at the contour point during scanning operations and dynamic stress along where the top silicon layer and transition layer adjoin are below a predetermined value. In another example, the reinforcement structure includes one or more cavities. In another example, the one or more cavities on the reinforcement structure are aligned with a center of the MEMS scanner. In another example, the cavities are positioned where stress is minimal at the MEMS scanner and to reduce mass of the reinforcement structure. In another example, the stress is distributed during operation of the MEMS scanner and the electronic device. In another example, the configuration of the reinforcement structure to distribute the stress is contingent upon a unique design of the mirror, in which the configuration varies by shape and size.

A further example includes an apparatus, comprising: an imager configured to generate imaging light; a micro-electro mechanical system (MEMS) scanner having a longitudinal axis and configured to reflect the imaging light, which includes: a reflecting deposit layer; a top silicon layer coupled to a backside of the reflecting deposit layer; and a reinforcement structure coupled to the top silicon layer and including a bottom silicon layer and a transition layer positioned between the top silicon layer and the bottom silicon layer, in which the reinforcement structure is shaped with stress contour points extending in opposite directions along the longitudinal axis, and stresses are distributed in the reinforcement structure during scanning operation so that stress levels located around the stress contour points are higher relative to stress levels at a transition between the transition layer and the top silicon layer to thereby maintain mirror flatness during scanning operations.

In another example, the reinforcement structure is a silicon-on-insulator structure or a silicon-on-sapphire structure. In another example, the reflecting deposit layer includes one or more of metal, gold, bare silicon, or dielectric stack. In another example, the stress contour points are oriented in a direction of flexures which facilitate the scanning operation of the MEMS scanner and cause dynamic stress to be distributed to the stress contour points. In another example, the reinforcement structure includes one or more cavities to reduce its mass. In another example, the configuration and a design of the reinforcement structure and the one or more cavities on the reinforcement structure vary by case according to a design and configuration, collectively, of the reflecting deposit layer, the top silicon layer, the transition layer, and the mirror.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A micro-electro mechanical system (MEMS) scanner disposed in an electronic device, comprising:
   a mirror configured to reflect image light on a reflecting side of the mirror; and
   a silicon-on-insulator (SOI) wafer having a longitudinal axis and a transverse axis attached to an underside of the mirror opposite the reflecting side, the SOI wafer having a top silicon layer, a bottom silicon layer, and a silicon oxide layer disposed between the top silicon layer and the bottom silicon layer,
   a pair of torsional flexures disposed along the longitudinal axis of the SOI wafer at respective opposite ends of the mirror for providing dynamic rotation of the mirror during scanning operations, and
   a backside reinforcement structure formed in the bottom silicon layer and silicon oxide layer and centered in the SOI wafer opposite the mirror and including a pair of contour points aligned along the longitudinal axis and formed as acute projections that respectively extend longitudinally towards the torsional flexures.

2. The MEMS scanner of claim 1, in which the pair of contour points of the SOI wafer are projections which extend parallel to a surface area of the mirror.

3. The MEMS scanner of claim 1, in which the SOI wafer includes rounded features extending laterally outward along the transverse axis.

4. The MEMS scanner of claim 1, in which the electronic device in which the MEMS scanner is disposed includes any one of a display device, imaging device, and light detection and ranging (LIDAR) device.

5. A micro-electro mechanical system (MEMS) scanner having a longitudinal axis and a transverse axis, comprising:
   a reflecting deposit layer having a frontside configured to reflect light and a backside opposite the frontside;
   a top silicon layer adjacent to the backside of the reflecting deposit layer;
   a pair of torsional flexures disposed along the longitudinal axis of the MEMS scanner at respective opposite ends of the reflecting deposit layer for providing dynamic rotation of the reflecting deposit layer during operations of the MEMS scanner; and
   a backside reinforcement structure adjacent to the top silicon layer, the backside reinforcement structure having a bottom silicon layer and a transition layer positioned between the top and bottom silicon layers, in which the backside reinforcement structure includes a pair of contour points aligned along the longitudinal axis and formed as acute projections that respectively extend longitudinally towards the torsional flexures.

6. The MEMS scanner of claim 5, in which maximum dynamic stress is concentrated at the contour points during scanning operations and dynamic stress along where the top silicon layer and transition layer adjoin are below a predetermined value.

7. The MEMS scanner of claim 5, in which the backside reinforcement structure includes one or more cavities.

8. The MEMS scanner of claim 7, in which the one or more cavities on the backside reinforcement structure are aligned with a center of the MEMS scanner.

9. The MEMS scanner of claim 7, in which the cavities are positioned where stress is minimal at the MEMS scanner and to reduce mass of the backside reinforcement structure.

10. An apparatus, comprising:
an imager configured to generate imaging light;
a micro-electro mechanical system (MEMS) scanner having a longitudinal axis and configured to reflect the imaging light, which includes:
a reflecting deposit layer;
a top silicon layer coupled to a backside of the reflecting deposit layer;
a pair of torsional flexures disposed along the longitudinal axis of the MEMS scanner at respective opposite ends of the reflecting deposit layer for providing dynamic rotation of the reflecting deposit layer during operations of the MEMS scanner; and
a backside reinforcement structure coupled to the top silicon layer and including a bottom silicon layer and a transition layer positioned between the top silicon layer and the bottom silicon layer, in which the backside reinforcement structure is shaped with contour points formed as acute projections respectively extending in opposite directions along the longitudinal axis towards the torsional flexures.

11. The apparatus of claim 10, in which the backside reinforcement structure is a silicon-on-insulator structure or a silicon-on-sapphire structure.

12. The apparatus of claim 10, in which the reflecting deposit layer includes one or more of metal, gold, bare silicon, or dielectric stack.

13. The apparatus of claim 10, in which the backside reinforcement structure includes one or more cavities to reduce its mass.

* * * * *